(12) United States Patent
Kono et al.

(10) Patent No.: US 10,186,572 B2
(45) Date of Patent: Jan. 22, 2019

(54) SEMICONDUCTOR DEVICE

(71) Applicant: KABUSHIKI KAISHA TOSHIBA, Tokyo (JP)

(72) Inventors: Hiroshi Kono, Himeji Hyogo (JP); Teruyuki Ohashi, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 32 days.

(21) Appl. No.: 15/444,269

(22) Filed: Feb. 27, 2017

(65) Prior Publication Data

US 2018/0083095 A1    Mar. 22, 2018

(30) Foreign Application Priority Data

Sep. 16, 2016 (JP) .................. 2016-181951

(51) Int. Cl.
| | |
|---|---|
| H01L 29/06 | (2006.01) |
| H01L 29/16 | (2006.01) |
| H01L 29/10 | (2006.01) |
| H01L 21/04 | (2006.01) |
| H01L 29/66 | (2006.01) |
| H01L 29/739 | (2006.01) |
| H01L 29/78 | (2006.01) |

(52) U.S. Cl.
CPC .......... H01L 29/063 (2013.01); H01L 21/046 (2013.01); H01L 29/1095 (2013.01); H01L 29/1608 (2013.01); H01L 29/66068 (2013.01); H01L 29/7395 (2013.01); H01L 29/7802 (2013.01)

(58) Field of Classification Search
USPC ....................................................... 257/77
See application file for complete search history.

(56) References Cited

U.S. PATENT DOCUMENTS

| | | | |
|---|---|---|---|
| 7,332,770 B2 | 2/2008 | Kobayashi | |
| 2014/0231867 A1* | 8/2014 | Yamashita | H01L 29/872 257/140 |
| 2016/0071949 A1* | 3/2016 | Hiyoshi | H01L 21/02529 438/268 |
| 2017/0271442 A1* | 9/2017 | Uehara | H01L 29/0634 |

FOREIGN PATENT DOCUMENTS

| | | |
|---|---|---|
| JP | 2015-119157 A | 6/2015 |
| WO | 2010-038150 A1 | 4/2010 |

* cited by examiner

*Primary Examiner* — Moazzam Hossain
*Assistant Examiner* — Lawrence C Tynes, Jr.
(74) *Attorney, Agent, or Firm* — Patterson & Sheridan, LLP

(57) ABSTRACT

A semiconductor device includes first, second, and gate electrodes. A first silicon carbide region of a first type is between the first and second electrodes and between the gate and second electrodes. Second and third silicon carbide regions of a second type are between the first electrode and first silicon carbide region. A portion of the first silicon carbide region is between the second and third silicon carbide regions. A fourth silicon carbide region of the first type is between the first electrode and second silicon carbide region. A fifth silicon carbide region of the first type is between the first electrode and third silicon carbide region. An insulation layer is between the gate electrode and second and third silicon carbide regions and sixth silicon carbide region of the second type. A second portion of the first silicon carbide region is between the second electrode and sixth silicon carbide region.

14 Claims, 7 Drawing Sheets

SEMICONDUCTOR DEVICE

CROSS-REFERENCE TO RELATED APPLICATION

This application is based upon and claims the benefit of priority from Japanese Patent Application No. 2016-181951, filed Sep. 16, 2016, the entire contents of which are incorporated herein by reference.

FIELD

Embodiments described herein relate generally to a semiconductor device.

BACKGROUND

Silicon carbide is expected to be used as a material for next-generation semiconductor devices. Silicon carbide has better physical properties than does silicon in that the band gap is 3 times, breakdown electric field intensity is about 10 times, and thermal conductivity is about 3 times that of silicon. When these characteristics are utilized, metal oxide semiconductor field effect transistors (MOSFETs) or insulated gate bipolar transistors (IGBTs) capable of operating at high breakdown voltage, at low loss, and at high temperature can be realized.

For example, when the MOSFET is short-circuited across the silicon carbide region due to malfunction of a circuit, a large voltage is applied between a source and a drain, and thus a large current flows. Similarly, when the IGBT is short-circuited, a high voltage is applied between an emitter and a collector, and thus a large current flows. A time from the short-circuit state to a breakdown of the MOSFET or the IGBT is referred to as short-circuit tolerance. In order to prevent the breakdown of the MOSFET or the IGBT when the MOSFET or the IGBT is short-circuited, it is desirable to improve the short-circuit tolerance of the device.

DETAILED DESCRIPTION

Figure 1:
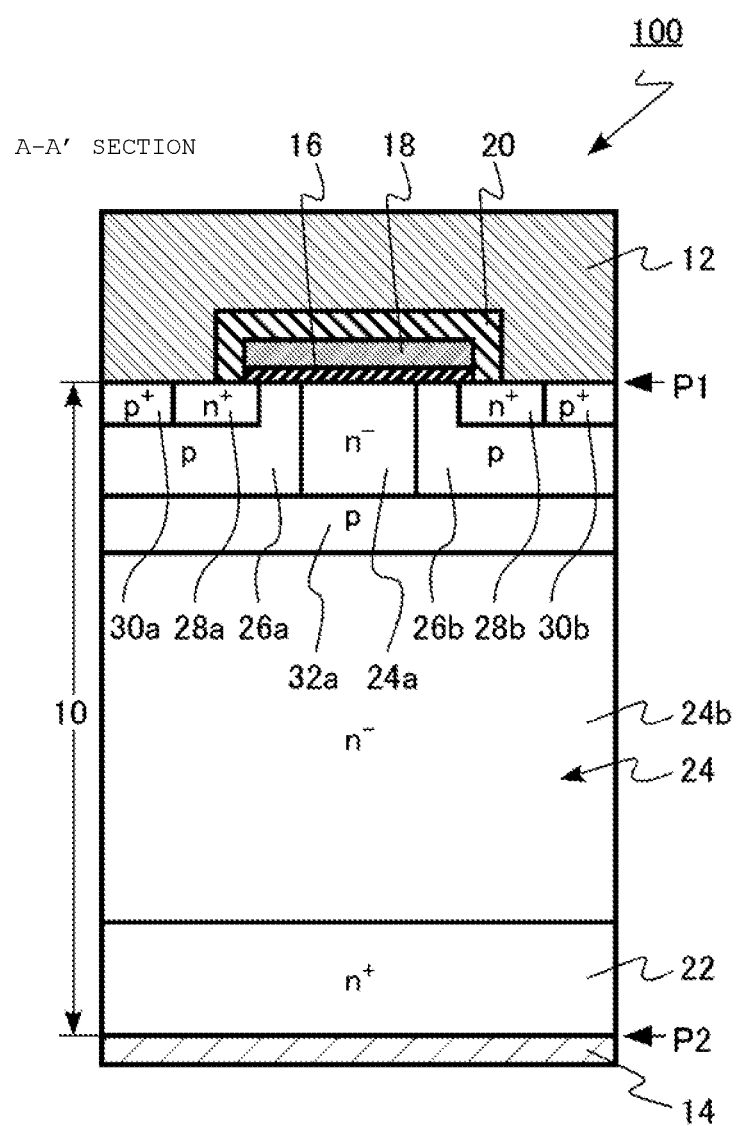
FIG. 1 is a schematic sectional view of a semiconductor device according to a first embodiment.

An exemplary embodiment provides a semiconductor device capable of improving short-circuit tolerance.

In general, according to one embodiment, a semiconductor device includes a first electrode, a second electrode, a gate electrode, a first silicon carbide region of a first conductivity type at least partially between the first electrode and the second electrode and at least partially between the gate electrode and the second electrode. The semiconductor device further includes a second silicon carbide region of a second conductivity type between the first electrode and the first silicon carbide region, and a third silicon carbide region of the second conductivity type between the first electrode and the first silicon carbide region. A first portion of the first silicon carbide region is between the second silicon carbide region and the third silicon carbide region. A fourth silicon carbide region of the first conductivity type is between the first electrode and the second silicon carbide region and separated from the first silicon carbide region. A fifth silicon carbide region of the first conductivity type is between the first electrode and the third silicon carbide region and separated from the first silicon carbide region. A gate insulation layer is between the gate electrode and the second silicon carbide region and between the gate electrode and the third silicon carbide region, and a sixth silicon carbide region of the second conductivity type is in contact with the second silicon carbide region, the third silicon carbide region, and the first portion of the first silicon carbide region between the second and third silicon carbide regions. The first portion of the first silicon carbide region is between the gate electrode and the sixth silicon carbide region, and a second portion of the first silicon carbide region is between the second electrode and the sixth silicon carbide region.

Hereinafter, embodiments will be described with reference to the drawings. In the following description, identical or similar elements are given the same reference symbols, and a description of elements described once will not be repeated where appropriate.

In the following description, the notation of $n^+$, n, $n^-$, and $p^+$, p, and $p^-$ indicate relative levels of impurity concentration of conductivity types. That is, $n^+$ indicates that an n-type impurity concentration is relatively higher than n and $n^-$ indicates that an n-type impurity concentration is relatively lower than n. Further, $p^+$ indicates that a p-type impurity concentration is relatively higher than p and $p^-$ indicates that a p-type impurity concentration is relatively lower than p. Furthermore, $n^+$ and $n^-$ types are simply notated as an n-type and $p^+$ and $p^-$ types are simply notated as a p-type in some cases.

An impurity concentration can be measured by, for example, a secondary ion mass spectrometry (SIMS). The relative difference of an impurity concentration can also be determined from a carrier concentration difference obtained by, for example, scanning capacitance microscopy (SCM). In addition, a distance such as a depth or a thickness of an impurity region can be obtained by the SIMS method, for example. Moreover, a distance such as a depth, a thickness, a width, or a space of the impurity region can be obtained from a synthetic image of an SCM image and an AFM (Atomic Force Microscope) image.

First Embodiment

A semiconductor device according to this embodiment includes a first electrode, a second electrode, a gate electrode, a first silicon carbide region of a first conductivity type at least partially located between the first electrode and the second electrode and at least partially located between the gate electrode and the second electrode, a second silicon carbide region of a second conductivity type located between the first electrode and the first silicon carbide region, a third silicon carbide region of the second conductivity type located between the first electrode and the first silicon carbide region, wherein a first portion of the first silicon carbide region is located between the second silicon carbide region and the third silicon carbide region, a fourth silicon carbide region of the first conductivity type located between the first electrode and the second silicon carbide region and separated from the first silicon carbide region, a fifth silicon carbide region of the first conductivity type located between the first electrode and the third silicon carbide region and separated from the first silicon carbide region, a gate insulation layer located between the gate electrode and the second silicon carbide region and between the gate electrode and the third silicon carbide region, and a sixth silicon carbide region of the second conductivity type in contact with the second silicon carbide region, the third silicon carbide region, and the first portion of the first silicon carbide region located between the second and third silicon carbide regions, wherein the first portion of the first silicon carbide region is also located between the gate electrode and the sixth silicon carbide region and a second portion of the first silicon carbide region is located between the second electrode and the sixth silicon carbide region.

Figure 2:
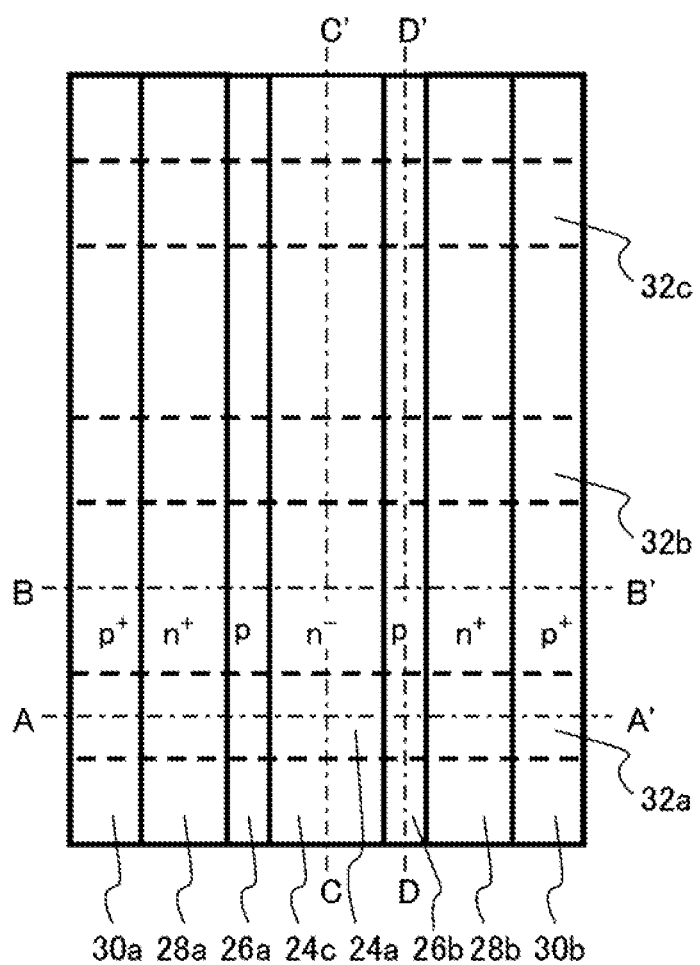
FIG. 2 is a schematic top view of the semiconductor device according to the first embodiment.
Figure 3:
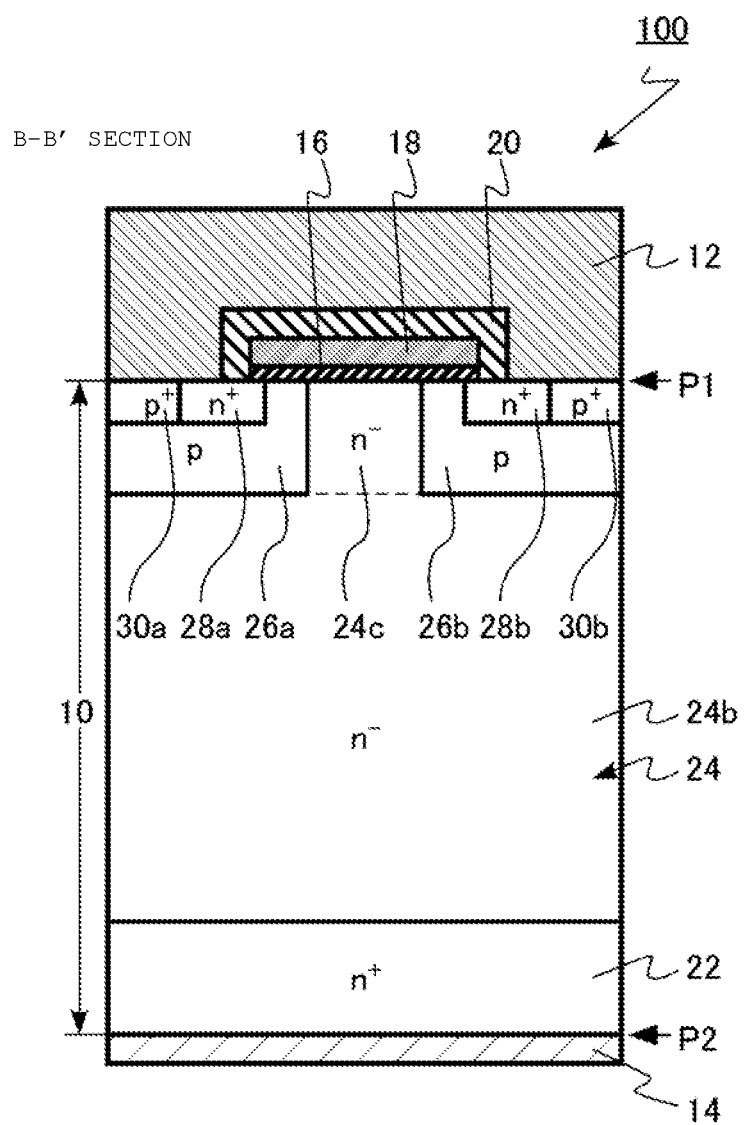
FIG. 3 is a schematic sectional view of the semiconductor device according to the first embodiment.
Figure 4:
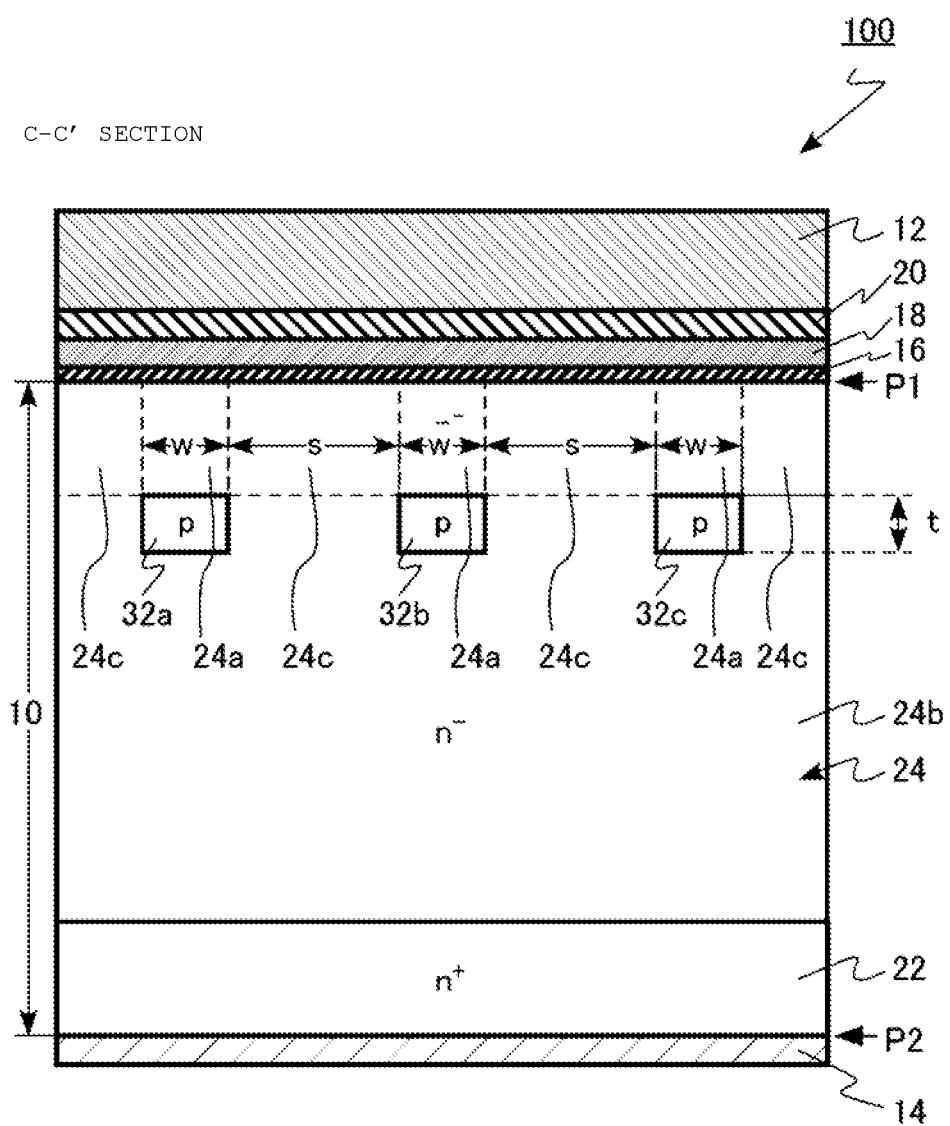
FIG. 4 is a schematic sectional view of the semiconductor device according to the first embodiment.
Figure 5:
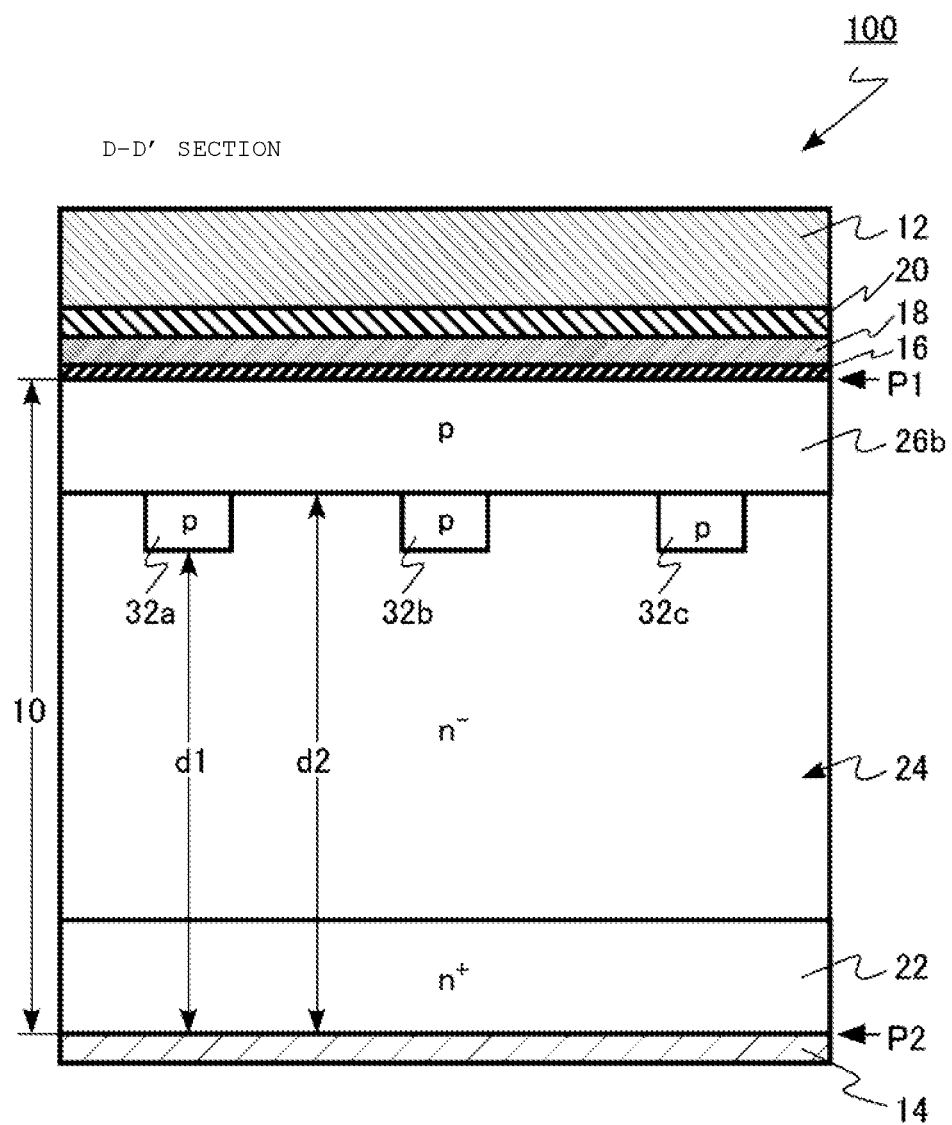
FIG. 5 is a schematic sectional view of the semiconductor device according to the first embodiment.

FIG. 1 is a schematic sectional view of the semiconductor device according to this embodiment. FIG. 2 is a schematic top view of the semiconductor device according to this embodiment. FIG. 2 is a diagram illustrating impurity region patterns on a surface and an inside of a silicon carbide layer. FIGS. 3, 4, and 5 are schematic sectional views of the semiconductor device according to this embodiment. FIG. 1 is a sectional view taken along line A-A' in FIG. 2. FIG. 3 is a sectional view taken along line B-B' in FIG. 2. FIG. 4 is a sectional view taken along line C-C' in FIG. 2. FIG. 5 is a sectional view taken along line D-D' in FIG. 2.

The semiconductor device according to this embodiment is a planar gate type vertical MOSFET 100 using silicon carbide. The MOSFET 100 according to this embodiment is, for example, a double implantation MOSFET (DIMOSFET) in which a body region and a source region are formed by ion implantation.

Hereinafter, a case where a first conductivity type is an n-type and a second conductivity type is a p-type will be described as an example. The MOSFET 100 is a vertical n-channel type MOSFET using electrons as a carrier.

The MOSFET 100 includes a silicon carbide layer 10, a source electrode (first electrode) 12, a drain electrode (second electrode) 14, a gate insulation layer 16, a gate electrode 18, and an interlayer insulating layer 20.

The silicon carbide layer 10 includes an n$^+$ type drain region 22, an n$^-$ type drift region (first silicon carbide region) 24, a p-type first body region 26a (second silicon carbide region), a p-type second body region 26b (third silicon carbide region), and n$^+$ type first source region 28a (fourth silicon carbide region), an n$^+$ type second source region 28b (fifth silicon carbide region), a p$^+$ type first body contact region 30a, a p$^+$ type second body contact region 30b, a first p-type region 32a (sixth silicon carbide region), a second p-type region 32b (seventh silicon carbide region), and a third p-type region 32c (FIG. 4).

At least a part of the silicon carbide layer 10 is provided between the source electrode 12 and the drain electrode 14.

At least a part of the silicon carbide layer 10 is provided between the gate electrode 18 and the drain electrode 14. The silicon carbide layer 10 has a structure of monocrystalline SiC. The silicon carbide layer 10 has a crystal structure of 4H—SiC, for example.

The silicon carbide layer 10 includes a first surface ("P1" in FIG. 1) and a second surface ("P2" in FIG. 1). Hereinafter, the first surface is also referred to as a front surface, and the second surface is also referred to as a rear surface. A "depth" described hereinafter means a depth inwardly of the silicon carbide from the first surface.

The first surface is, for example, a surface having an inclined angle of not less than 0° and not more than 8° relative to a (0001) plane. In addition, the second surface is, for example, a surface having an inclined angle of not less than 0° and not more than 8° relative to a (000-1) plane. The (0001) plane is referred to as a silicon plane. The (000-1) plane is referred to as a carbon plane.

The n$^+$ type drain region 22 is provided as the rear surface of the silicon carbide layer 10. The drain region 22 contains, for example, nitrogen (N) as an n-type impurity. An impurity concentration of the n-type impurities in the drain region 22 is not less than $1 \times 10^{18}$ cm$^{-3}$ and not more than $1 \times 10^{21}$ cm$^{-3}$, for example.

The n$^-$ type drift region 24 is provided on the drain region 22. The drift region 24 contains, for example, nitrogen (N) as an n-type impurity. An impurity concentration of the n-type impurities in the drift region 24 is lower than the impurity concentration of the n-type impurities in the drain region 22. The impurity concentration of the n-type impurities in the drift region 24 is not less than $4 \times 10^{14}$ cm$^{-3}$ and not more than $1 \times 10^{17}$ cm$^{-3}$, for example. A thickness of the drift region 24 is, for example, 5 μm or more and 150 μm or less.

The drift region 24 includes a first portion 24a located between the gate electrode 18 and the first p-type region 32a and a second portion 24b located between the first p-type region 32a and the drain electrode 14. The drift region 24 includes a third portion 24c (FIG. 3) located between the gate electrode 18 and the drain electrode 14.

The first portion 24a and the third portion 24c are located between the first body region 26a and the second body region 26b. The first portion 24a is held in the third portion 24c. The third portion 24c is located between the gate electrode 18 and the second portion 24b.

The impurity concentration of n-type impurities in each of the first portion 24a and the third portion 24c is higher than the impurity concentration of n-type impurities in the second portion 24b, for example. The impurity concentration of the n-type impurities in each of the first portion 24a and the third portion 24c is greater by one order of magnitude or more than the impurity concentration of the n-type impurities in the second portion 24b, for example. The impurity concentration of the n-type impurities in each of the first portion 24a and the third portion 24c is, for example, not less than $1 \times 10^{16}$ cm$^{-3}$.

As the impurity concentration of the n-type impurities in each of the first portion 24a and the third portion 24c become higher, a width of a depletion layer extending from the first body region 26a, the second body region 26b, and the first p-type region 32a can be suppressed, and an on-state resistance of the MOSFET 100 can be reduced.

For example, the impurity concentration of the n-type impurities in the first portion 24a is higher than the impurity concentration of the n-type impurities in the third portion 24c. As the impurity concentration of the n-type impurities in the first portion 24a becomes higher, the width of the depletion layer extending upward from the first p-type region 32a can be particularly suppressed, and the on-state resistance of the MOSFET 100 can be further reduced.

The first body region 26a and the second body region 26b are provided between the source electrode 12 and the second portion 24b of the drift region 24. A portion of the first body region 26a and a portion of the second body region 26b, both of which are in contact with the gate insulation layer 16, function as a channel region of the MOSFET 100.

The first body region 26a and the second body region 26b contain, for example, aluminum (Al) as a p-type impurity.

An impurity concentration of the p-type impurities in each of the first body region 26a and the second body region 26b has a peak value of not less than $1\times10^{17}$ cm$^{-3}$ and not more than $1\times10^{19}$ cm$^{-3}$, for example.

A depth of each of the first body region 26a and the second body region 26b is, for example, 0.3 μm or more and 0.8 μm or less.

The first source region 28a is provided between the source electrode 12 and the first body region 26a. The first source region 28a is separated from the drift region 24.

The second source region 28b is provided between the source electrode 12 and the second body region 26b. The second source region 28b is separated from the drift region 24.

The first source region 28a and the second source region 28b contain, for example, phosphorus (P) as an n-type impurity. An impurity concentration of the n-type impurities in each of the first source region 28a and the second source region 28b is higher than the impurity concentration of the n-type impurities in the drift region 24.

The impurity concentration of the n-type impurities in each of the first source region 28a and the second source region 28b is, for example, not less than $1\times10^{19}$ cm$^{-3}$ and not more than $1\times10^{21}$ cm$^{-3}$. The first source region 28a and the second source region 28b have a shallower depth than that of the first body region 26a and the second body region 26b, the depth being 0.1 μm or more and 0.3 μm or less, for example.

The first source region 28a and the second source region 28b are fixed to the potential of the source electrode 12.

The p$^+$ type first body contact region 30a is provided between the source electrode 12 and the first body region 26a. An impurity concentration of the p-type impurities in the first body contact region 30a is higher than the impurity concentration of the p-type impurities in the first body region 26a.

The p$^+$ type second body contact region 30b is provided between the source electrode 12 and the second body region 26b. An impurity concentration of the p-type impurities in the second body contact region 30b is higher than the impurity concentration of the p-type impurities in the second body region 26b.

The first body contact region 30a and the second body contact region 30b contain, for example, aluminum (Al) as a p-type impurity. The impurity concentration of the p-type impurities in each of the first body contact region 30a and the second body contact region 30b is, for example, not less than $1\times10^{19}$ cm$^{-3}$ and not more than $1\times10^{21}$ cm$^{-3}$.

A depth of each of the first body contact region 30a and the second body contact region 30b is, for example, 0.3 μm or more and 0.6 μm or less.

Each of the first p-type region 32a, the second p-type region 32b, and the third p-type region 32c is in contact with the first body region 26a and the second body region 26b. When each of the first p-type region 32a, the second p-type region 32b, and the third p-type region 32c is in contact with the first body region 26a and the second body region 26b, the first p-type region 32a, the second p-type region 32b, and the third p-type region 32c are fixed to the same potential as that of the first body region 26a and the second body region 26b. For example, the first p-type region 32a, the second p-type region 32b, and the third p-type region 32c are fixed to the potential of the source electrode 12.

The first portion 24a of the drift region 24 is located between the gate electrode 18 and each of the first p-type region 32a, the second p-type region 32b, and the third p-type region 32c. The second portion 24b of the drift region 24 is located between the drain electrode 14 and each of the first p-type region 32a, the second p-type region 32b, and the third p-type region 32c.

Each of the first p-type region 32a, the second p-type region 32b, and the third p-type region 32c contains, for example, aluminum (Al) as a p-type impurity. An impurity concentration of the p-type impurities in each of the first p-type region 32a, the second p-type region 32b, and the third p-type region 32c is, for example, not less than $1\times10^{17}$ cm$^{-3}$ and not more than $1\times10^{19}$ cm$^3$.

A depth of each of the first p-type region 32a, the second p-type region 32b, and the third p-type region 32c in silicon carbide layer 10 is, for example, 0.3 μm or more and 1.2 μm or less. A thickness (t in FIG. 4) in the depth direction of the silicon carbide layer 10 of each of the first p-type region 32a, the second p-type region 32b, and the third p-type region 32c is, for example, 0.2 μm or more and 0.5 μm or less.

For example, the depth of each of the first p-type region 32a, the second p-type region 32b, and the third p-type region 32c is deeper than the depth of each of the first body region 26a and the second body region 26b. In other words, a distance (d1 in FIG. 5) between each of the first p-type region 32a, the second p-type region 32b, and the third p-type region 32c, and the drain electrode 14 is shorter than a distance (d2 in FIG. 5) between each of the first body region 26a and the second body region 26b, and the drain electrode 14.

A width (w in FIG. 4), in the direction crossing the direction extending between the first and second electrodes, of each of the first p-type region 32a, the second p-type region 32b, and the third p-type region 32c is, for example, 1.0 μm or more and 3.0 μm or less. Spaces (s in FIG. 4) between the first p-type region 32a and the second p-type region 32b and between the second p-type region 32b and the third p-type region 32c are, for example, 2.0 μm or more and 6.0 μm or less.

For example, the spaces between the first p-type region 32a and the second p-type region 32b and between the second p-type region 32b and the third p-type region 32c are larger than the width of each of the first p-type region 32a, the second p-type region 32b, and the third p-type region 32c. For example, the space between the first p-type region 32a and the second p-type region 32b and between the second p-type region 32b and the third p-type region 32c is twice or more as large as the width of each of the first p-type region 32a, the second p-type region 32b, and the third p-type region 32c.

Each of the first p-type region 32a, the second p-type region 32b, and the third p-type region 32c can be formed by selective ion implantation of the p-type impurity from the front surface of the silicon carbide layer 10, for example.

The gate electrode 18 is a conductive layer. The gate electrode 18 is made of polycrystalline silicon including the p-type impurity or the n-type impurity, for example.

The gate insulation layer 16 is provided between the gate electrode 18 and the first body region 26a. In addition, the gate insulation layer 16 is provided between the gate electrode 18 and the second body region 26b. Furthermore, the gate insulation layer 16 is provided between the gate electrode 18 and the first portion 24a of the drift region 24.

For example, the gate insulation layer 16 is made of silicon oxide. As the gate insulation layer 16, for example, a High-k insulating material (high dielectric constant insulating material) is applicable.

The interlayer insulating layer 20 is provided on the gate electrode 18. The interlayer insulating layer 20 is made of, for example, silicon oxide.

The source electrode 12 is in contact with the first source region 28a and the second source region 28b. The source electrode 12 is in contact with the first body contact region 30a and the second body contact region 30b.

The source electrode 12 is formed of a metal. The metal forming the source electrode 12 has a stacked structure of titanium (Ti) and aluminum (Al), for example. A region of the source electrode 12 coming in contact with the silicon carbide layer 10 is made of, for example, metal silicide. An example of the metal silicide includes titanium silicide or nickel silicide.

The drain electrode 14 is provided on the rear surface of the silicon carbide layer 10. The drain electrode 14 is in contact with the drain region 22.

The drain electrode 14 is made of, for example, a metal or a metal semiconductor compound. For example, the drain electrode 14 contains a material selected from the group consisting of nickel silicide, titanium (Ti), nickel (Ni), silver (Ag), and gold (Au).

Operations and effects of the MOSFET 100 according to this embodiment will be described below.

For example, when the MOSFET is short-circuited due to malfunction of the circuit, a high voltage is applied between the source and the drain, and a large current flows. When the large current continues to flow through the MOSFET for a long time, the MOSFET results in being broken down.

The MOSFET is required not to be broken down until the flowing current is interrupted from the outside thereof after the MOSFET is short-circuited. A predetermined time is required to interrupt the flowing current from the outside. Accordingly, it is desirable to improve a time from the short-circuit state to the breakdown of the MOSFET, that is, short-circuit tolerance.

Figure 6A:
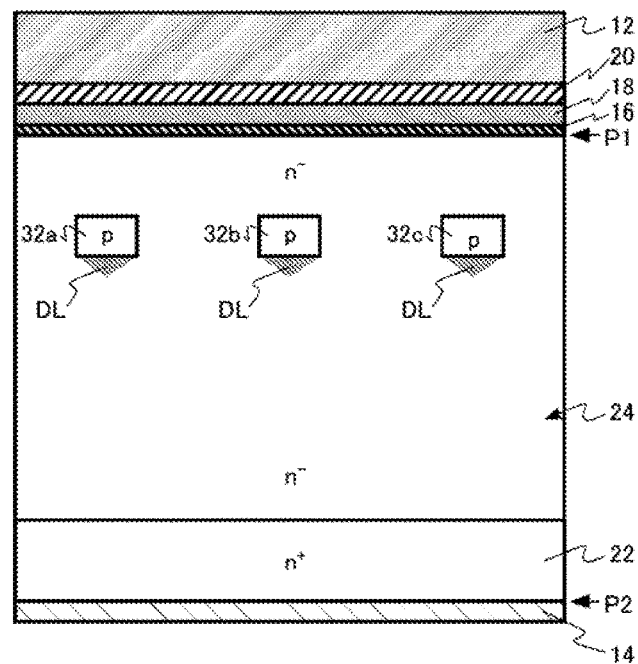
FIGS. 6A and 6B are schematic sectional views of the semiconductor device according to the first embodiment.
Figure 6B:
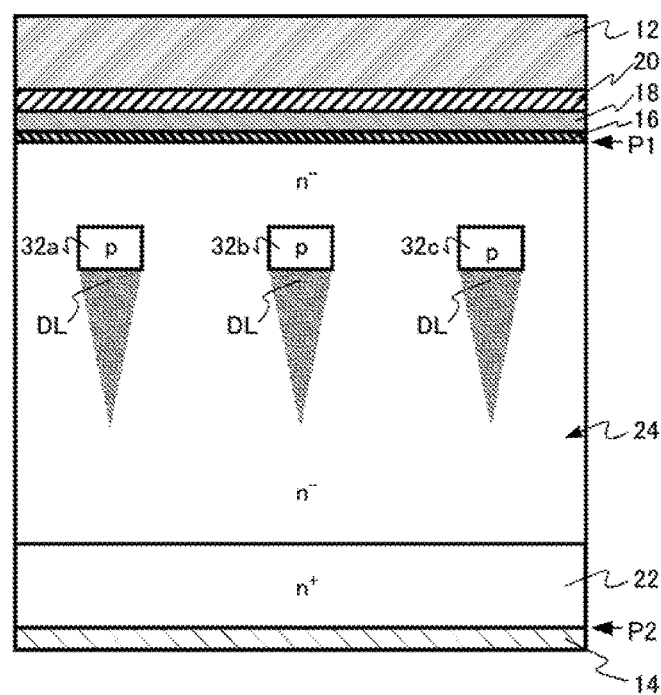

FIGS. 6A and 6B are diagrams explaining operations and effects of the semiconductor device according to this embodiment. FIG. 6A is a diagram explaining a normal ON-state of the MOSFET. FIG. 6B is a diagram explaining a case where a short circuit occurs in the MOSFET. FIGS. 6A and 6B are sectional views corresponding to FIG. 4.

When the MOSFET is in the normal ON-state as illustrated in FIG. 6A, a small voltage is applied between the source electrode 12 and the drain electrode 14. Therefore, a small voltage is also applied between the drift region 24 and each of the first p-type region 32a, the second p-type region 32b, and the third p-type region 32c.

For this reason, the extension of a depletion layer DL extending from the first p-type region 32a, the second p-type region 32b, and the third p-type region 32c to the drift region 24 is small. Therefore, the influence of the depletion layer DL on the current flowing in the drift region 24 is small.

On the other hand, when the short circuit occurs in the MOSFET, a large voltage is applied between the source electrode 12 and the drain electrode 14. Accordingly, a large voltage is also applied between the drift region 24 and each of the first p-type region 32a, the second p-type region 32b, and the third p-type region 32c.

For this reason, the extension of the depletion layer DL extending from the first p-type region 32a, the second p-type region 32b, and the third p-type region 32c to the drift region 24 becomes remarkably larger compared to the case where the MOSFET is in the normal ON-state. No current flows in the depletion layer DL. Due to the depletion layer DL greatly extending into the drift region 24, a path of the current flowing in the drift region 24 is limited.

Therefore, the on-state resistance of the MOSFET increases at the time of the short circuit. In other words, the current flowing between the source electrode 12 and the drain electrode 14 at the time of the short circuit becomes small. As a result, it is possible to improve the time from the short-circuit state to the breakdown of the MOSFET, that is, the short-circuit tolerance.

It is desirable that the spaces (s in FIG. 4) between the first p-type region 32a and the second p-type region 32b and between the second p-type region 32b and the third p-type region 32c be larger than the width (w in FIG. 4) of each of the first p-type region 32a, the second p-type region 32b, and the third p-type region 32c. When the spaces between the first p-type region 32a and the second p-type region 32b, and between the second p-type region 32b and the third p-type region 32c become relatively narrow, the path of the current in the normal ON-state of the MOSFET narrows, and the on-state resistance may be increased.

It is desirable that the width (w in FIG. 4) of each of the first p-type region 32a, the second p-type region 32b, and the third p-type region 32c be 1.0 µm or more and 3.0 µm or less. When the width is less than the above range, the short-circuit tolerance may not be sufficiently improved. When the width exceeds the above range, the on-state resistance in the normal ON-state of the MOSFET will be undesirably increased.

It is desirable that the spaces (s in FIG. 4) between the first p-type region 32a and the second p-type region 32b, and between the second p-type region 32b and the third p-type region 32c be 2.0 µm or more and 6.0 µm or less. When the space is less than the above range, the on-state resistance in the normal ON-state of the MOSFET will be undesirably increased. When the space exceeds the above range, the short-circuit tolerance may not be sufficiently improved.

It is desirable that the thickness (t in FIG. 4) of each of the first p-type region 32a, the second p-type region 32b, and the third p-type region 32c be 0.2 µm or more and 0.5 µm or less. When the thickness is less than the above range, the first p-type region 32a, the second p-type region 32b, and the third p-type region 32c are completely depleted at the time of the short circuit, and thus the extension of the depletion layer DL will be reduced. When the thickness exceeds the above range, a threshold voltage of the MOSFET may be difficult to control due to the influence of a tail of the distribution of the p-type impurity introduced into the silicon carbide layer 10 by ion implantation during formation of the first p-type region 32a, the second p-type region 32b, and the third p-type region 32c.

It is desirable that the depth of each of the first p-type region 32a, the second p-type region 32b, and the third p-type region 32c be deeper than the depth of the first body region 26a or the second body region 26b. In other words, it is desirable that the distance (d1 in FIG. 5) between each of the first p-type region 32a, the second p-type region 32b, and the third p-type region 32c, and the drain electrode 14 is shorter than the distance (d2 in FIG. 5) between each of the first body region 26a and the second body region 26b, and the drain electrode 14. It is thereby possible to avoid the difficulty in controlling a threshold voltage of the MOSFET due to the influence of a tail of distribution of the p-type impurity introduced into the silicon carbide layer 10 by ion implantation during formation of the first p-type region 32a, the second p-type region 32b, and the third p-type region 32c.

As described above, according to this embodiment, the MOSFET 100 capable of improving the short-circuit tolerance is realized.

Second Embodiment

A semiconductor device of this embodiment differs from that of the first embodiment in that the semiconductor device is an IGBT. Hereinafter, the same contents as those in the first embodiment will not be described.

Figure 7:
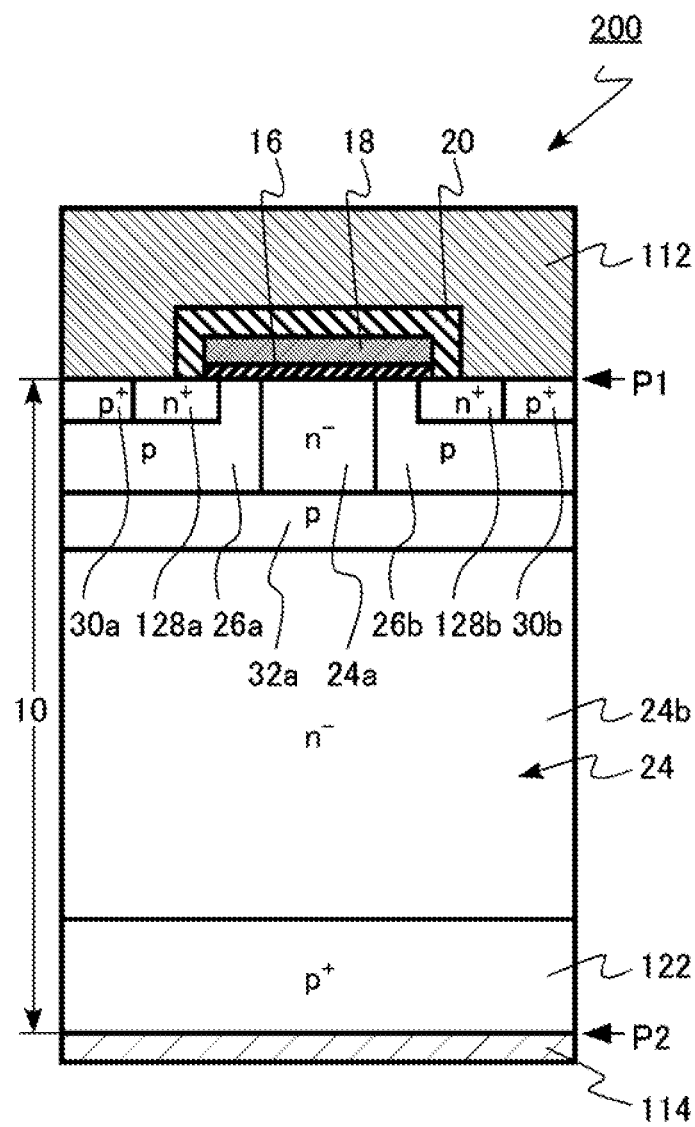
FIG. 7 is a schematic sectional view of a semiconductor device according to a second embodiment.

FIG. 7 is a schematic sectional view of the semiconductor device according to this embodiment. FIG. 7 corresponds to FIG. 1 in which the semiconductor device of the first embodiment is illustrated.

The semiconductor device according to this embodiment is a planar gate type vertical IGBT 200 using silicon carbide.

Hereinafter, a case where a first conductivity type is an n-type and a second conductivity type is a p-type will be described as an example.

An IGBT 200 includes a silicon carbide layer 10, an emitter electrode (first electrode) 112, a collector electrode (second electrode) 114, a gate insulation layer 16, a gate electrode 18, and an interlayer insulating layer 20.

The silicon carbide layer 10 includes a $p^+$ type collector region 122, an $n^-$ type drift region (first silicon carbide region) 24, a p-type first body region 26a (second silicon carbide region), a p-type second body region 26b (third silicon carbide region), an $n^+$ type first emitter region 128a (fourth silicon carbide region), an $n^+$ type second emitter region 128b (fifth silicon carbide region), a $p^+$ type first body contact region 30a, a $p^+$ type second body contact region 30b, a first p-type region 32a (sixth silicon carbide region), a second p-type region 32b (seventh silicon carbide region), and a third p-type region 32c.

The structure of the IGBT 200 differs from that of the MOSFET 100 of the first embodiment illustrated in FIG. 1 only in that the $n^+$ type drain region 22 of the MOSFET 100 is replaced by the $p^+$ type collector region 122.

According to this embodiment, the IGBT 200 capable of improving short-circuit tolerance is realized by the same operation as in the first embodiment.

In the first and second embodiments, the description is made with respect to the case where the crystal structure of SiC is 4H—SiC, as an example. However, the present disclosure can also be applicable to devices using another crystal structure of SiC such as 6H—SiC or 3C—SiC. Further, the surface of the silicon carbide layer 10 may have planes other than the (0001) plane.

In the first and second embodiments, the description is made with respect to the case where the first conductivity type is the n-type and the second conductivity type is the p-type, as an example. However, the first conductivity type and the second conductivity type can also be the p-type and the n-type, respectively.

In the first and second embodiments, aluminum (Al) is exemplified as the p-type impurity. However, boron (B) can be used as the p-type impurity. Further, nitrogen (N) and phosphorus (P) are exemplified as the n-type impurity, but arsenic (As), antimony (Sb), or the like can also be applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first electrode;
   a second electrode;
   a gate electrode;
   a first silicon carbide region of a first conductivity type at least partially between the first electrode and the second electrode and at least partially between the gate electrode and the second electrode;
   a second silicon carbide region of a second conductivity type between the first electrode and the first silicon carbide region;
   a third silicon carbide region of the second conductivity type between the first electrode and the first silicon carbide region, wherein a first portion of the first silicon carbide region is between the second silicon carbide region and the third silicon carbide region;
   a fourth silicon carbide region of the first conductivity type between the first electrode and the second silicon carbide region and separated from the first silicon carbide region;
   a fifth silicon carbide region of the first conductivity type between the first electrode and the third silicon carbide region and separated from the first silicon carbide region;
   a gate insulation layer between the gate electrode and the second silicon carbide region and between the gate electrode and the third silicon carbide region;
   a sixth silicon carbide region of the second conductivity type in contact with the second silicon carbide region, the third silicon carbide region and the first portion of the first silicon carbide region being between the second silicon carbide region and third silicon carbide region; and
   a seventh silicon carbide region of the second conductivity type in contact with the second silicon carbide region and the third silicon carbide region, wherein
   the first portion of the first silicon carbide region is between the gate electrode and the sixth silicon carbide region,
   a second portion of the first silicon carbide region is between the second electrode and the sixth silicon carbide region,
   the first portion of the first silicon carbide region is between the gate electrode and the seventh silicon carbide region,
   the second portion of the first silicon carbide region is between the second electrode and the seventh silicon carbide region, and
   the first silicon carbide region is between the sixth silicon carbide region and the seventh silicon carbide region.

2. The semiconductor device according to claim 1, wherein
   the sixth silicon carbide region and the seventh silicon carbide region have a width in a direction crossing the direction between the first electrode and the second electrode, and
   the distance between the sixth silicon carbide region and the seventh silicon carbide region is larger than the width of the sixth silicon carbide region and larger than the width of the seventh silicon carbide region.

3. The semiconductor device according to claim 2, wherein the sixth silicon carbide region and the seventh silicon carbide region are formed by ion implantation.

4. The semiconductor device according to claim 3, wherein the width of the sixth silicon carbide region and the seventh silicon carbide region is greater than or equal to 1.0 µm and less than or equal to 3.0 µm.

5. The semiconductor device according to claim 4, wherein the spacing between the sixth silicon carbide region and the seventh silicon carbide region is greater than or equal to 2.0 µm and less than or equal to 6.0 µm.

6. The semiconductor device according to claim 3, wherein the thickness of the sixth silicon carbide region and the seventh silicon carbide region is less than or equal to 0.5 µm and greater than or equal to 0.2 µm.

7. The semiconductor device according to claim 1, wherein
the sixth silicon carbide region has a thickness in the direction extending between the first and second electrodes of 0.2 µm or more.

8. The semiconductor device according to claim 1, wherein
the first portion of the first silicon carbide region has an impurity concentration of impurities of the first conductivity type higher than that of the second portion of the first silicon carbide region.

9. The semiconductor device of claim 1, wherein
the closest distance between the sixth silicon carbide region and the second electrode is less than the closest distance between the second silicon carbide region and the second electrode.

10. The semiconductor device according to claim 1, further comprising:
an eighth silicon carbide region of the first conductivity type between the first silicon carbide region and the second electrode, wherein the impurity concentration of the first type impurity in the eighth silicon carbide region is greater than the impurity concentration of the first type impurity in the first silicon carbide region, wherein
a channel region is formed at the interface of the gate insulation layer and the second silicon carbide region and at the interface of the gate insulation layer and the third silicon carbide region.

11. A semiconductor device, comprising:
a first electrode;
a second electrode;
a gate electrode;
a first silicon carbide region of a first conductivity type at least partially between the first electrode and the second electrode and at least partially between the gate electrode and the second electrode;
a second silicon carbide region of a second conductivity type between the first electrode and the first silicon carbide region;
a third silicon carbide region of the second conductivity type between the first electrode and the first silicon carbide region, wherein a first portion of the first silicon carbide region is between the second silicon carbide region and the third silicon carbide region;
a fourth silicon carbide region of the first conductivity type between the first electrode and the second silicon carbide region and separated from the first silicon carbide region;
a fifth silicon carbide region of the first conductivity type between the first electrode and the third silicon carbide region and separated from the first silicon carbide region;
a gate insulation layer between the gate electrode and the second silicon carbide region and between the gate electrode and the third silicon carbide region; and
a plurality of sixth silicon carbide regions of the second conductivity type in contact with the second silicon carbide region, the third silicon carbide region, and the first portion of the first silicon carbide region between the second silicon carbide region and the third silicon carbide region, wherein
a second portion of the first silicon carbide region is between the second electrode and the sixth silicon carbide regions.

12. The semiconductor device of claim 11, wherein
the plurality of sixth silicon carbide regions are spaced from one another in a direction crossing the direction extending between the first electrode and the second electrode; and
the spacing between the plurality of sixth silicon carbide regions is greater than the width of the plurality of sixth silicon carbide regions in a direction crossing the direction extending between the first electrode and the second electrode.

13. The semiconductor device according to claim 12, wherein the width of at least two of the plurality of sixth semiconductor regions is greater than or equal to 1.0 µm and less than or equal to 3.0 µm.

14. The semiconductor device according to claim 12, wherein the spacing between at least two adjacent ones of the plurality of sixth semiconductor regions is greater than or equal to 2.0 µm and less than or equal to 6.0 µm.

* * * * *